United States Patent [19]

DeLai et al.

[11] 4,186,046

[45] Jan. 29, 1980

[54] GROWING DOPED SINGLE CRYSTAL CERAMIC MATERIALS

[75] Inventors: A. Joseph DeLai, Reading; Charles P. Gazzara, Medford, both of Mass.

[73] Assignee: The United States of America as represented by the Secretary of the Army, Washington, D.C.

[21] Appl. No.: 855,488

[22] Filed: Nov. 28, 1977

Related U.S. Application Data

[63] Continuation of Ser. No. 727,911, Sep. 29, 1976, abandoned.

[51] Int. Cl.² .................. B01J 17/08; B01J 17/20; B01J 17/36
[52] U.S. Cl. .................. 156/605; 156/617 V; 156/DIG. 61; 156/DIG. 63; 156/DIG. 78; 156/DIG. 95; 422/248
[58] Field of Search .............. 156/617 V, DIG. 61, 156/617 R, 617 H, 605, 617 M, DIG. 63, 620; 422/248, 249, 250

[56] References Cited

U.S. PATENT DOCUMENTS

| | | | |
|---|---|---|---|
| 2,866,700 | 12/1958 | Bohnet | 156/620 |
| 2,898,249 | 8/1959 | Jensen | 156/605 |
| 3,211,654 | 10/1965 | Jacob | 156/605 |
| 3,619,131 | 11/1971 | Grabmaier | 156/DIG. 61 |
| 3,642,443 | 2/1972 | Blum | 156/617 V |
| 3,653,432 | 4/1972 | Schmid | 156/DIG. 61 |
| 3,781,209 | 12/1973 | Reuschel | 156/620 |
| 3,898,051 | 8/1975 | Schmid | 156/616 |
| 4,013,501 | 3/1977 | Uitert | 156/DIG. 63 |
| 4,050,905 | 9/1977 | Swinehart | 156/616 R |
| 4,096,025 | 6/1978 | Caslavsky | 156/DIG. 61 |

FOREIGN PATENT DOCUMENTS

| | | | |
|---|---|---|---|
| 1113682 | 9/1971 | Fed. Rep. of Germany | 156/620 |
| 37-16570 | 10/1962 | Japan | 156/DIG. 61 |
| 46-26201 | 7/1971 | Japan | 156/617 H |
| 902434 | 8/1962 | United Kingdom | 156/605 |
| 1242410 | 8/1971 | United Kingdom | 156/617 V |

OTHER PUBLICATIONS

Grodkiewicz et al., Cryst. Growth Suppl., J. of Phy. & Chem. of Solids, pp. 441–444 (1967).
Burrus et al., Applied Physics Letters, vol. 26, No. 6, Mar. 15, 1975, pp. 318–320.
Potoin et al., Crystal Growing, Northern Elec. TELESIS, pp. 274–279, vol. #9, Oct. 1970.

*Primary Examiner*—Stephen J. Emery
*Attorney, Agent, or Firm*—Nathan Edelberg; Robert P. Gibson; Lawrence E. Labadini

[57] ABSTRACT

An improved process for growing single crystals of ceramic material according to the gradient furnace technique is disclosed. The process combines the gradient furnace technique with principles of zone leveling and comprises seeding the melt of a ceramic material in a crucible, heating the crucible to above the melting point of the material and solidifying the material to form a single crystal by extracting heat from the bottom portion of the crucible. The application of zone leveling principles to this system comprises melting the ceramic material by creating a molten zone at the bottom portion of the crucible and passing the zone up the crucible to progressively melt successive portions of the ceramic material therein.

3 Claims, 1 Drawing Figure

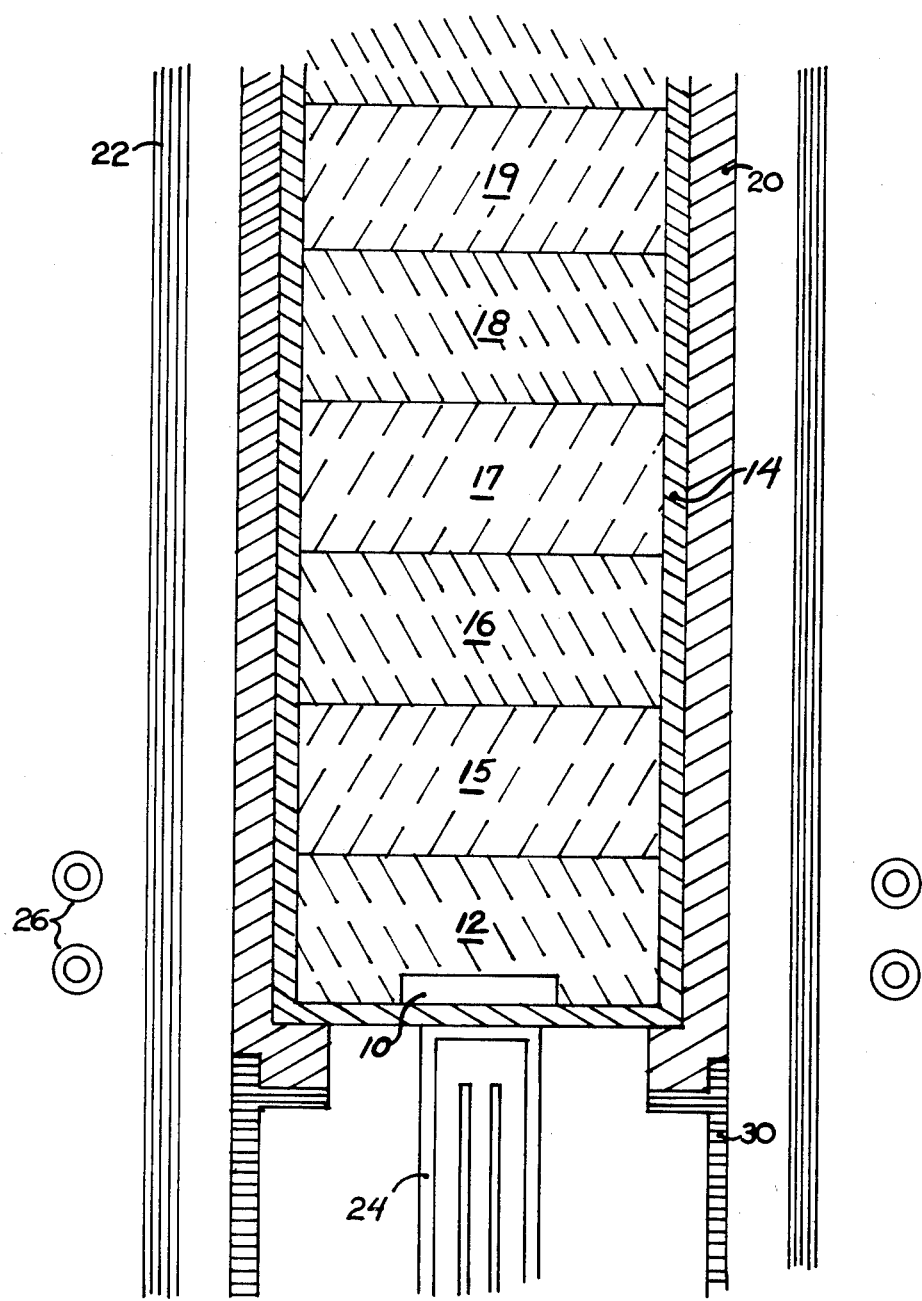

GROWING DOPED SINGLE CRYSTAL CERAMIC MATERIALS

The invention described herein may be manufactured and used by and for the Government for governmental purposes without the payment of any royalties thereon or therefor.

This is a continuation of application Ser. No. 727,911, filed Sept. 29, 1976, now abandoned.

BACKGROUND OF THE INVENTION

The growth of single crystals of various ceramic materials according to a process known as the "gradient furnace" technique is disclosed in U.S. Pat. No. 3,653,432 issued to Schmid and Viechnicki. In accordance with that process, the uni-directional solidification of high temperature ceramic materials to produce single crystals is accomplished by seeding the melt of a ceramic material, melting the ceramic material under vacuum conditions while uni-directionally cooling the melt by passage of a coolant gas against the closed end of a heat exchanger located at the bottom portion of a crucible. The material is caused to uni-directionally solidify by decreasing the temperature of the melt while increasing the flow of coolant gas. The size of crystals grown according to this technique, however, is limited by the relatively small size of the crucibles which must be utilized in order to achieve complete melting of the material.

It is generally known that single crystals of yttrium aluminum garnet (YAG) provide an excellent laser material when approximately one atomic percent of $Nd^{+3}$ ions are dissolved and retained therein during crystal growth. However, it has been found that the $Nd^{+3}$ ions are not evenly distributed during crystal growth because the $Nd_{+3}$ ions are rejected at the growth interface and the molten ceramic material tends to build up a concentration of $Nd^{+3}$ ions which result in an undesirable range of $Nd^{+3}$ concentration throughout the single crystal ingot. This has been found to be the case regardless of whether the crystal is grown according to the gradient furnace technique or any of the other known techniques for growing YAG crystals.

Single crystals of materials such as germanium, which are used in the semiconductor industry, have been grown according to a technique known as "zone leveling". This technique, which is particularly useful when it is desired to introduce impurities into the crystal, is described in great detail in a book by William G. Pfann entitled "Zone Melting" published by John Wiley & Sons, Inc., New York, 1958. According to this technique, a floating molten zone is used to melt successive portions of the material from which the crystal is to be grown. However, it has not heretofore been known that the technique of zone leveling could be combined with the gradient furnace technique to grow single crystals of ceramic material which would be virtually limitless in size, and could be grown with a constant concentration of dopant throughout the crystal where such constant concentration result is required such as, for example, in the case of $Nd^{+3}$ doped YAG for laser applications.

SUMMARY OF THE INVENTION

It has now been found that single crystals of ceramic material can be grown according to a technique which comprises a modification of the gradient furnace technique using the principles of zone leveling. Specifically, this result is accomplished by melting the ceramic material by creating a molten zone at the bottom portion of the crucible within which the crystal is to be grown, and passing the zone up the crucible to progressively melt successive portions of the material within the crucible as each such portion corresponds to the position of the zone. While melting is being accomplished, and as crystal growth continues, the melt temperature is slowly decreased by extracting heat from a bottom portion of the crucible, in the manner described in U.S. Pat. No. 3,653,432.

The process of the present invention can be used to grow single crystals which are doped with a specific range of dopant. This is significant where the single crystal possesses certain desirable physical properties only if doped within that range, and not if the concentration of the dopant is outside the desired range. The process of the present invention is particularly adaptable to the growth of YAG crystals which are required to be doped with approximately one atomic percent of $Nd^{+3}$ ions if such crystals are to be usable for laser applications. The present process provides a method for growing rather large crystals of such material which will possess a uniform concentration of dopant thereby resulting in much less waste than is presently experienced when doped crystals are grown according to any of the known techniques. To this end, the ceramic material can be added to the crucible in the form of separate sintered billets which have been prepared with $Nd^{+3}$ doping. Since, as noted above, the ions are rejected at the growth interface during crystal growth, the amount of dopant in each billet is provided such that the amount of dopant retained by each billet after melting will be approximately equal.

In addition to YAG crystals which are doped with neodymium ions, crystals doped with holmium and erbium ions can also be produced. Further, the process of the present invention can be utilized to fabricate single crystals of $Al_2O_3$, $MgAl_2O_4$, and eutectics of $Al_2O_3/ZrO_2$ and $Al_2O_3/Y_3Al_5O_{12}$.

DETAILED DESCRIPTION OF THE INVENTION

For a more complete understanding of the invention, reference should be made to the following detailed description and drawing in which the FIGURE is a partial schematic representation of the apparatus used to carry out the process of the present invention.

The apparatus comprises, generally, crucible 14 supported by pedestal 30. A graphite liner 20 is provided to enable heat to be conducted from R.F. heater coil 26 to the crucible. R.F. heater coil 26 is movably mounted within the apparatus to effect passage of the molten zone up the crucible. Heat exchanger 24 is provided at the bottom portion of the crucible 14 and can be of the type generally described in U.S. Pat. No. 3,653,432. If desired, the R.F. coils 26 may be placed inside a quartz cover 22 so that they will generate enough heat to achieve a small enough and hot enough zone to melt the material within the crucible 14. Further, as will be apparent to those of ordinary skill in the art, the R.F. coils may be replaced by any heating element which is capable of providing enough localized heat to form the molten zone.

In a preferred embodiment of the present invention, billet 12 is prepared with a single crystal disc of YAG 10 in position at the bottom of crucible 14. The crucible is preferably of high melting point material such as molybdenum, tungsten, irridium, or rhenium, or of plated materials thereof. Billet 12 can be sintered directly in the crucible 14. The remaining billets 15–19, are prepared in another crucible. The specific type of furnace used to sinter the billets is not significant. However, under normal circumstances the billets as prepared should show an increase in density of three times over a mere mixture of $Al_2O_3$ and $Y_2O_3$ powders.

Once the remaining billets are in place in the crucible, the growth process is begun by creating a molten zone at the bottom portion of the crucible by R.F. heater coil 26 heating graphite liner 20 which in turn causes a zone of the crucible 14 to be heated. The temperature of the molten zone is raised to a temperature above the melting point of the ceramic material and held at such temperature until conditions within the zone begin to stabilize. The molten zone is then passed up crucible 14 at a very slow rate. In the case of YAG, the molten zone is moved at a rate of approximately 1 millimeter per hour. Crystal growth is commenced by beginning the flow of helium into heat exchanger 24 as described in U.S. Pat. No. 3,653,432.

During the entire crystal growth process, the temperature at the center of the seed is never allowed to increase above the melting point of the material. This is accomplished by controlling the flow of helium into the heat exchanger 24. As crystal growth continues, the melt temperature is slowly decreased by decreasing the furnace power until growth of the crystal is complete. Further, the entire process can be carried out under vacuum as disclosed in U.S. Pat. No. 3,653,432, or in the presence of an inert gas which serves to maintain a positive gas pressure above the material. It has been found that the use of an inert gas reduces volatilization of the components thus keeping the composition of the materials during the growth process constant.

When it is desired to grow YAG crystals which are doped with $Nd^{+3}$ ions, recognizing that the ions will be rejected at the growth interface, the amount of dopant included in each of the billets can be adjusted so that the amount retained by each billet after melting will be approximately equal. Thus, the amount of dopant placed in billet 12 is chosen such that the difference in the amount rejected by this billet and the average amount of dopant which will be retained thereby, is added to the amount of dopant to be added to billet 15 so that the average amount retained by billet 15 after melting will then be the same as that retained by billet 12. For example, in the case of YAG crystals grown according to the process of the present invention, the starting composition may be approximately 1–1.5 atomic percent $Nd^{+3}$ in billet 12 or $C_{12}$. If the $Nd^{+3}$ composition of billet 12 after melting is $C_{12}av.$, the composition of billet 15 is $C_{15}$ plus the difference between $C_{12}$ and $C_{12}av.$, where $C_{12}$ is greater than $C_{15}$. It will be clear that the starting compositions of each of the sintered billets 16–19, respectively, would be proportionately lower to yield a final composition of the overall ingot such that $C_{12}av.$, $C_{15}av.$, $C_{16}av.$, $C_{17}av.$, etc., would all be nearly equal.

By growing the single crystals according to the present invention, the size of the crystals are limited only by the size of the crucible available since the melting of the material is accomplished in stages by simply moving a molten zone of the material vertically along the length of the crucible. Further, since the technique described enables uniform concentration of dopant to be achieved no matter how great the size of the crystal grown, the process results in a great increase in cost effectiveness over the known methods for growing doped crystals where such a result was not possible due to the waste involved of the portions of the crystal in which the concentration of dopant was outside the desired range.

As will be apparent to those skilled in the art, a further advantage which results from the present invention resides in the use of sintered billets having increased density over a mere mixture of powders which allows the capability of using a smaller crucible for producing the same size crystal that can be achieved with powdered starting materials. Further, the sintered billets tend to contract from the crucibles thereby allowing for easy removal of the billets and re-use of the crucible for sintering of further billets.

While the invention has been disclosed with a certain degree of particularity, it is to be understood that the present disclosure has been made by way of example only and that numerous variations as may become apparent to those skilled in the art may be made without departing from the spirit and the scope of the invention as hereinafter claimed.

What is claimed is:

1. In a process for growing single crystals from ceramic materials selected from the group consisting of $Y_3Al_5O_{12}$, $Al_2O_3$, $MgAl_2O_4$ and eutectics of $Al_2O_3/ZrO_2$ and $Al_2O_3/Y_3Al_5O_{12}$, and the dopant is selected from the group consisting of $Nd^{+3}$, $Ho^{+3}$, and $Er^{+3}$ ions including the steps of seeding the melt of a ceramic material in a crucible, heating the material to above its melting point, and solidifying the melted material to form a single crystal by extracting heat from a bottom portion of the crucible, the improvement comprising introducing said ceramic material to said crucible in the form of a plurality of vertically stacked sintered billets, providing a quantity of dopant in said sintered billets during the preparation thereof, the amount of dopant to be provided being established by first determining the amount of dopant that will be rejected by each billet at the growth interface of the crystal and then providing an amount of dopant in each billet such that the amount of dopant retained by each billet after melting will be approximately equal, whereby a doped crystal having a uniform dopant concentration is formed, melting only a portion of the ceramic material by creating a molten zone at the bottom portion of the crucible, passing said zone up the crucible to progressively melt successive portions of said ceramic material within the crucible as each such portion corresponds to the position of said molten zone, each of said billets having a vertical dimension approximately equal to the vertical dimension of said molten zone and melting and solidifying said ceramic material in the presence of an inert gas.

2. The process of claim 1 wherein the inert gas maintains a positive gas pressure above the ceramic material.

3. The process of claim 1 wherein the ceramic material is $Y_3Al_5O_{12}$ and the dopant is $Nd^{+3}$ ions.

* * * * *